United States Patent
Buer et al.

(10) Patent No.: US 6,642,559 B1
(45) Date of Patent: Nov. 4, 2003

(54) STRUCTURE AND PROCESS FOR IMPROVING HIGH FREQUENCY ISOLATION IN SEMICONDUCTOR SUBSTRATES

(75) Inventors: Kenneth Vern Buer, Pepperell, MA (US); Anthony Francis Quaglietta, Methuen, MA (US); Allen Hanson, Pepperell, MA (US)

(73) Assignee: The Whitaker Corporation, Wilmington, DE (US)

( * ) Notice: Subject to any disclaimer, the term of this patent is extended or adjusted under 35 U.S.C. 154(b) by 0 days.

(21) Appl. No.: 09/291,494

(22) Filed: Apr. 14, 1999

(51) Int. Cl.[7] .................. H01L 29/80; H01L 31/112; H01L 21/20; H01L 21/76
(52) U.S. Cl. .................. 257/275; 257/276; 438/381; 438/423
(58) Field of Search ................. 257/275, 523, 257/624, 664, 276–277, 621, 500–510; 333/104, 161, 204, 246, 181–184, 81 A, 81 B; 455/193.3; 438/214, 280, 411, 619, 381, 423

(56) References Cited

U.S. PATENT DOCUMENTS 4,672,335 A  *  6/1987  Webster ............... 333/22 R
4,910,157 A  *  3/1990  Hasegawa ............... 437/22
5,614,743 A  *  3/1997  Mochizuki ............... 257/276

FOREIGN PATENT DOCUMENTS

JP          401208870 A  *  8/1989  ........ 438/FOR 422

OTHER PUBLICATIONS

GaAs Processing Technique: William Ralph; Chapter 10; Device Isolation pp. 199–209, 1990.

* cited by examiner

Primary Examiner—Shouxiang Hu

(57) ABSTRACT

An isolation structure for high frequency integrated circuits is a conductive material disposed over a region of active gallium arsenide substrate. The conductive material over the active region creates a lossy RF path to reduce undesired coupling between adjacent conductors. In one case, two RF signal lines (1,2) terminated at the same via pad (3) have weaker coupling than in prior art via structures due to the lossy RF structure disposed on isolating fractional portions (10,11) of the via pad (3). The isolating fractional portion (10,11) are intermediate terminating fractional portions (8,9) of the via pad (3) to which the signal lines (1,2) are connected. In another case, two parallel bias lines (12,13) are disposed over an active layer region (6) increasing the RF loss between them and advantageously reducing the RF coupling. The reduced RF coupling improves RF isolation and permits increased miniaturization.

14 Claims, 3 Drawing Sheets

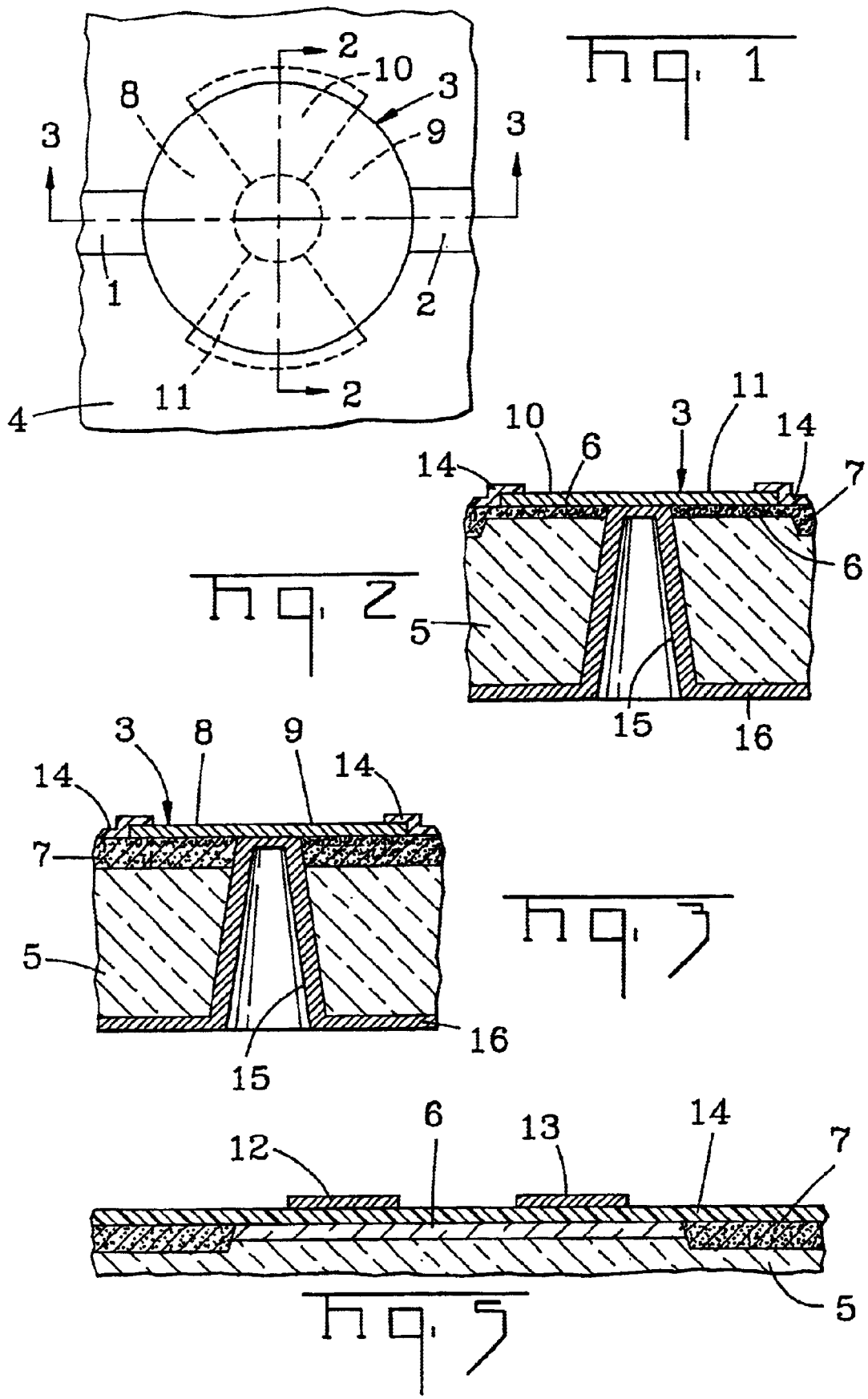

STRUCTURE AND PROCESS FOR IMPROVING HIGH FREQUENCY ISOLATION IN SEMICONDUCTOR SUBSTRATES

FIELD OF THE INVENTION

The present invention relates to semiconductor substrates and more specifically to a process for improving high frequency isolation between structures on a monolithic microwave integrated circuit.

BACKGROUND

Radio frequency ("RFI") and microwave integrated semiconductor circuits are used extensively in wireless communications. As technology progresses, these semiconductors must operate at higher frequencies, provide better performance, and permit increased miniaturization. One performance parameter whose improvement carries significant benefit toward achieving increased performance goals is RF isolation. RF isolation refers to the degree with which an RF signal present on a Monolithic Microwave Integrated Circuit ("MMIC") does not couple into a different RF signal path and present itself as noise. RF coupling can occur in various ways such as RF noise traveling through conductive traces that carry DC bias voltages or reference potential and through vias used to ground two or more signal lines. RF isolation becomes more of a a challenge at higher frequencies and at higher signal power levels.

There are many conventional design methods used to maximize RF isolation including spacing conductive traces sufficiently far apart from each other to minimize the coupling of electric fields from one trace into a neighboring trace and coupling capacitors connected to DC lines that appear as an RF short and a DC open circuit to short out any RF energy that couples into the bias lines. The additional space and discrete components that are added to the circuit increase the size of the MMIC which is in contravention to the interest in miniaturization.

There is a need, therefore, for an apparatus that improves RF isolation in MMICs without increasing the size of the circuit.

SUMMARY

It is an object of an embodiment according to the teachings of the present invention to improve the RF isolation on an MMIC.

It is an object of an embodiment according to the teachings of the present invention to improve the RF isolation without increasing the size of the MMIC or requiring additional circuitry.

An isolation structure comprises a semi-insulating substrate with an active region on a surface of the substrate. The active region is surrounded by a high resistivity region on the surface of said substrate, and a conductive material is disposed over a portion of the active region and a portion of the high resistivity region.

A process for creating a microwave semiconductor isolation structure on a substrate comprises the steps of creating an active layer on a surface of the substrate having a lower sheet resistivity than bare substrate and masking portions of said active layer with a photoresist material. The process includes the further steps of damaging portions of the active layer that are not protected by said photoresist layer to create localized regions of a high resistivity layer adjacent localized regions of an active layer. After removing the photoresist the process further includes forming a conductive material having first and second contiguous portions, the first portion disposed over a portion of the active region and the second portion disposed over a portion of the high resistivity region.

It is a feature of an embodiment according to the teachings of the present invention that a conductive material is disposed over both active and resistive layers on the substrate.

It is an advantage of an embodiment according to the teachings of the present invention that RF isolation is improved for RF vias and bias traces in an MMIC without increasing the size of the circuit by providing a weaker coupling path relative to the path to ground.

It is a further advantage of an embodiment according to the teachings of the present invention that bias traces may be more closely spaced than in prior art devices.

It is a further advantage of an embodiment according to the teachings of the present invention that a more than one RF signal line may be terminated to a single via by providing a higher relative coupling impedance between the RF paths than the impedance of the path to ground.

BRIEF DESCRIPTION OF THE DRAWINGS

FIG. 1 is a plan view of an RF isolated via according to the teachings of the present invention.

FIG. 2 is a cross sectional view of the RF isolated via of FIG. 1 taken along lines 2—2.

FIG. 3 is a cross sectional view of the RF isolated via of FIG. 1 taken along lines 3—3.

FIG. 5 is a cross sectional view of the RF isolated bias line of FIG. 4.

DETAILED DESCRIPTION

Figure 4:
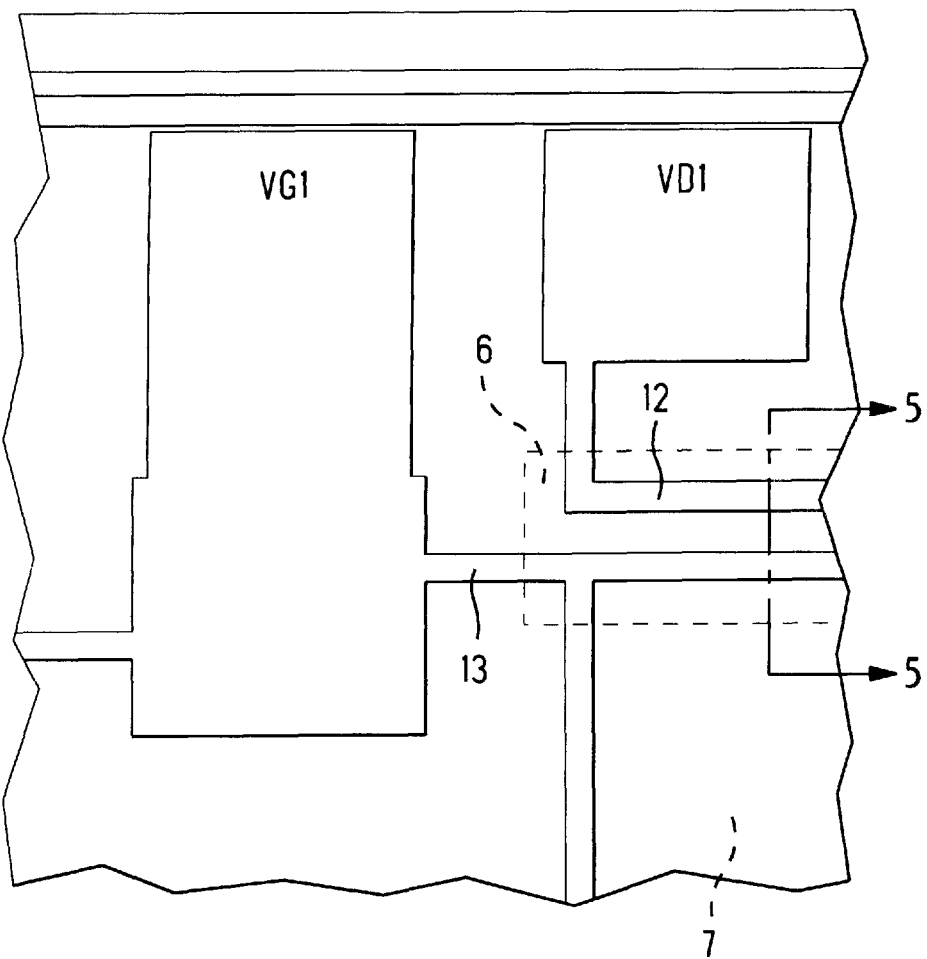
FIG. 4 is a plan view of an RF isolated bias line according to the teachings of the present invention.
Figure 6:
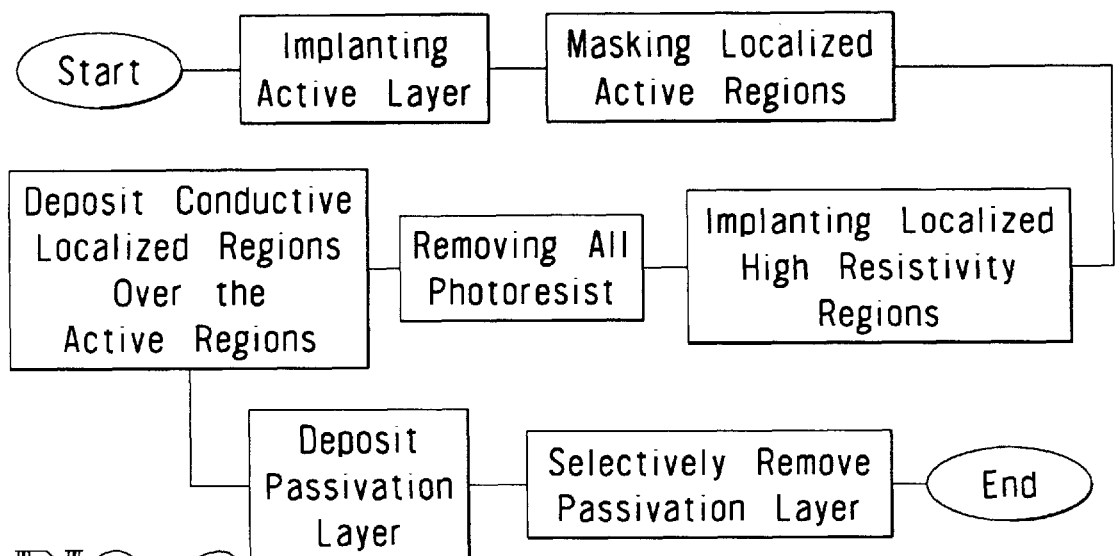
FIG. 6 is a flow chart of a process according to the teachings of the present invention.
Figure 7:
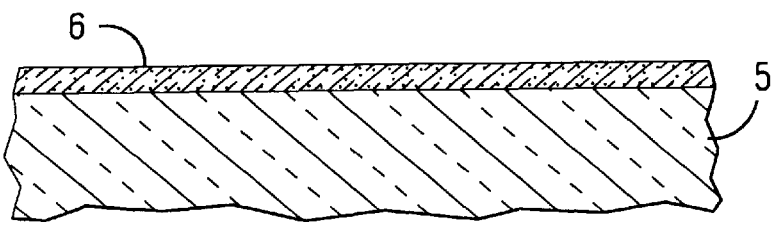
FIGS. 7–11 are cross sectional views of intermediate stages of a process of manufacture of a device according to the teachings of the present invention.
Figure 8:
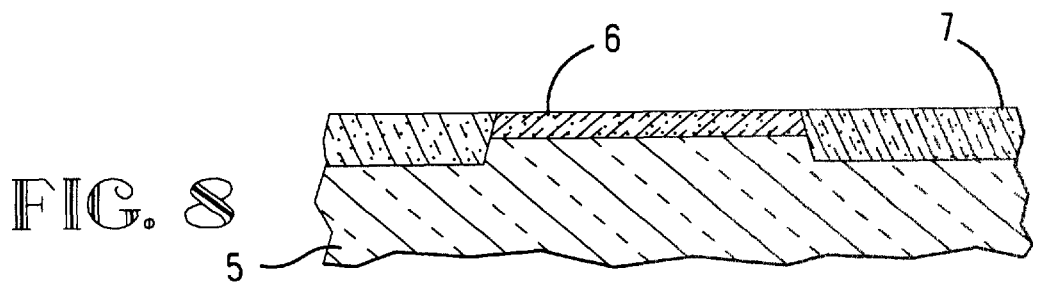
Figure 9:
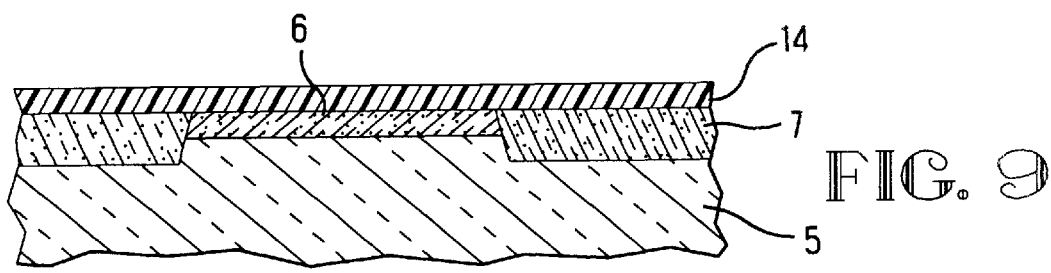
Figure 10:
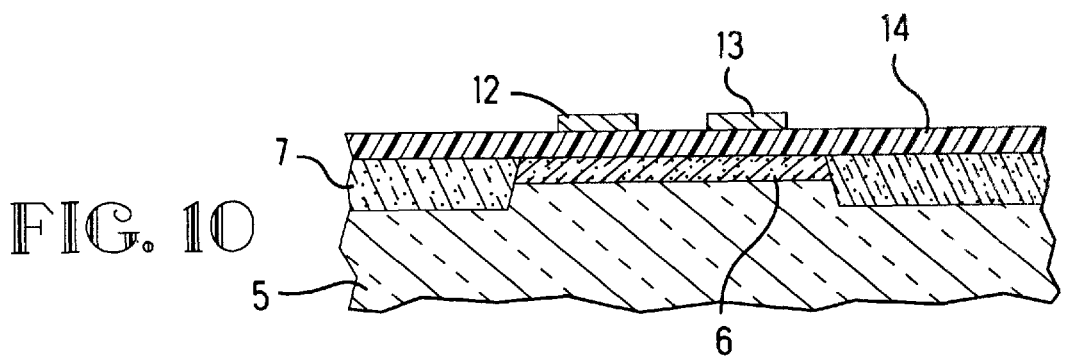
Figure 11:
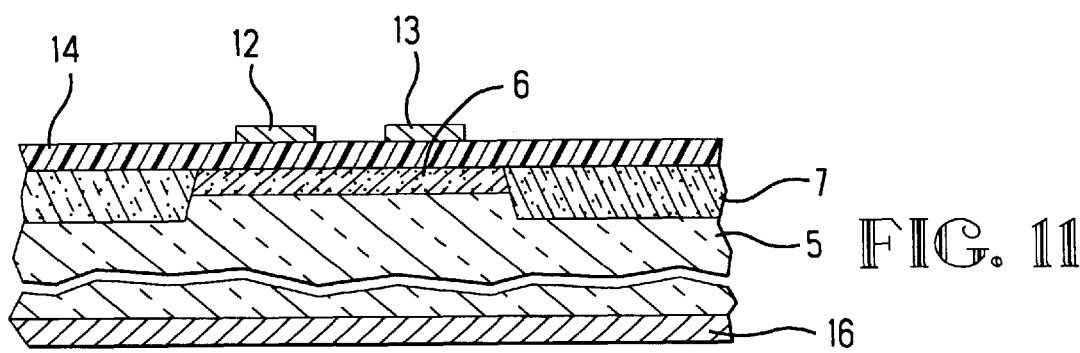

With specific reference to FIGS. 1–3 of the drawings, an isolation structure comprising a multiport via is shown in which, first and second RF signal lines 1,2 are terminated. The via comprises a through hole plated with a conductive via metal 15, for example Gold, and contacting a metal via pad 3 deposited on the front surface 4. By virtue of the electrical connection between the via metal 15 and the via pad 3, the via metal 15 conducts energy received by the via pad 3 to a metalized ground plane 16 on a backside of the substrate 5. The via metal 15 and the metalized ground plane 16 together form a continues piece of plated metal. Two RF signal lines 1,2 terminated in the same via pad 3 present a possibility of some RF coupling from the first RF signal line 1 to the second RF signal line 2 through the via pad 3. The coupling between the first and second signal lines 1,2 presents itself as noise reducing the RP isolation between the first and second signal lines 1,2. A solution to the challenge of reducing this coupling is to create RF lossy regions between the first and second signal lines 1,2 to reduce the coupling and to create a lower impedance path to ground through the via metal 15.

In a specific embodiment, a substrate 5 is semi-insulating gallium arsenide. The resistivity of the GaAs substrate is approximately 10–40 Mohms-cm. The surface 4 of the substrate 5 comprises selective regions of an active layer 6 surrounded by selective regions of a high resistivity layer 7. Together, the active and high resistivity regions 6,7 comprise the entire surface of the substrate 5. In the present embodiment, the active layer 6 comprises a silicon implant into the semi-insulating GaAs or may be grown epitaxially according to conventional practice. Alternatively, but less conventional is to create the active layer through dopant diffusion. An active layer created by either an implanted dopant or grown epitaxially exhibits a typical sheet resistivity of approximately 10–600 ohms per square depending upon the process used. In the present example, the high resistivity layer 7 comprises localized regions where the active layer structure is damaged by a boron implant. Other implants are possible such as oxygen and proton. For purposes of the present invention, the term high resistivity refers to a resistivity value wherein an RF impedance of a conductor disposed over the high resistivity region is lower than a conductor disposed over the active region. The resistivity of the high resistivity region in the present specific embodiment is approximately that of the semi-insulating substrate material. In the embodiment of a multiport via as disclosed, the via pad 3 is a substantially round layer of metal disposed on a surface of the substrate 5 and is delineated into first, second, third, and fourth fractional parts 8,9,10,11. Other via pad shapes are acceptable and are within the scope of the present teachings. Each one of first and second fractional parts 8,9 of the via pad 3 are disposed over respective ones of the selective regions of the high resistivity layer 7 of the substrate 5 and may be generally referred to as terminating fractional parts 8,9. Each one of third and fourth fractional parts 10,11 of the via pad 3 are disposed over respective ones of the selective regions of the active layer 6 of the substrate 5 and may be generally referred to as isolating fractional parts 10,11. A via positioned directly under the via pad 3 is metalized to cover the conical inner surface of the via and contacts the underside of the via pad 3, thereby making electrical contact. The via metal 15 also contacts the ground plane 16 to complete the electrical connection between via pad 3, via metal 15, and ground plane 16. A first conductive RF signal line 1 is contiguous with the first fractional part 8 of the via pad 3 thereby making electrical connection to the via metal 15 and the ground plane 16. A second conductive RF signal line 2 is contiguous with the second fractional part 9 of the via pad 3 and also makes electrical connection to the same via pad 3, the via metal 15 and the ground plane 16. The first and second fractional parts 8,9 of the via pad 3 are physically separated from each other by the third and fourth fractional parts 10,11 of the via pad 3. Accordingly, the via pad 3 is connected to more than one RF signal line 1,2 and hence the term isolated "multiport via". The active layer region 6 disposed underneath the third and fourth fractional parts 10,11 presents a lossy RF path between the first and second fractional parts. This reduces the coupling between the first and second fractional parts 8,9 and thereby provides improved RF isolation over prior art vias terminating more than one RF signal line. The multiport via may be generalized to terminate more than two RF signal lines. In the generalized embodiment, the terminating fractional parts electrically connect to respective RF signal lines. Each terminating fractional part is separated from all other terminating fractional parts by one or more isolating fractional parts. In this way, the isolating fractional parts present a relatively higher RF impedance path than the alternate RF path to ground through the via metal which advantageously, weakens the coupling between the RF signal lines.

With specific reference to FIGS. 4 & 5 of the drawings, there is shown another embodiment of an isolation structure according to the teachings of the present invention comprising first and second bias lines 12,13 running parallel and adjacent each other. The first and second bias lines 12,13 comprise printed conductive traces that carry DC bias voltages to parts of the MMIC circuit. The proximity of the two lines 12,13 present a possibility of RF coupling from one to the other. The closer the spacing between the two lines, the stronger the coupling. In an embodiment according to the teachings of the present invention, localized regions of the active layer 6 are surrounded by localized regions of the high resistivity layer 7. Together the localized regions of active and high resistivity layers 6,7 comprise the entire surface of the substrate 5. A passivation layer 14 is deposited over both the active and high resistivity regions 6,7. A portion of the conductive first and second bias lines 12,13 are disposed on top of a passivation layer 14 directly over the active layer 6 of the substrate 5 while surrounding portions of the bias lines 12,13 are disposed over the high resistivity layer 7. In the embodiment as shown in FIG. 4 of the drawings, the portion of the bias lines 12,13 with the possibility of the strongest RF coupling is the portion that is positioned over an active layer region 6 while portions of the bias lines 12,13 that are not closely positioned or positioned perpendicular to each other are disposed over the high resistivity layer regions 7. The traces that are disposed over the active layer 6 exhibit RF lossiness while permitting DC current to pass unattenuated. Because the RF energy is attenuated due to the lossiness of the trace, the coupling between the traces is weaker as the RF impedance along the trace is lower than the RF impedance between the lines 12,13. Accordingly, the isolation between the bias lines 12,13 is improved. Additionally, the bias lines 12,13 may be positioned closer together than in prior art devices without adversely affecting the RF isolation. An alternative embodiment include respective ones of the active layer regions 6 disposed under each separate bias line 12 or 13 with a high resistivity region 7 separating the two active layer regions 6. Other alternative and combinations will occur to one of ordinary skill in the art and are within the scope of the present teachings. With specific reference to FIGS. 6 through 11 of the drawings, there is shown a flow diagram and cross sections of an isolation structure according to the teachings of the present invention during intermediate steps of a process to create the structure. Specifically, the Figures show an embodiment of a single bias line in cross section according to the teachings of the present invention. In a preferred embodiment, the starting substrate 5 is semi-insulating gallium arsenide. This is a high resistivity material prior to active implant, epitaxial layer growth, or ion diffusion. A dopant is implanted or defused into the substrate 5 or is grown epitaxially to achieve the thin active layer 6 on the entire surface of the GaAs substrate 5. A typical n-type dopant is silicon which is either introduced into the crystal using ion implantation, disfussion or incorporated during the epitaxial growth process. Localized areas of the active layer 6 are masked with a photo sensitive polymer know as photoresist. The masked localized areas include those areas in which active devices will be created such as resistors, diodes and transistors and is performed according to conventional practice. According to the teachings of the present invention, however, certain ones of the localized areas include those areas on which certain passive devices will be placed, for example electrical ground vias and DC bias lines. The unmasked areas are then implant damaged, in the case of semi-insulating GaAs it is done typically with boron, to create the regions of high resistivity 7 surrounding the localized active layer regions 6. Together the active layer regions 6 and the high resistivity layer regions 7 comprise the entire surface of the substrate 5. Other materials that may be used to implant damage the active layer 6 include oxygen and proton, the use of which is within the capabilities of one of ordinary skill in the art. The photoresist on the localized active regions 6 is then removed and a passivation layer 14 of typically, a 500–10000 Angstrom thickness of Silicon Nitride, is deposited over the entire surface of the substrate 5.

For the bias line embodiment, an interconnect metal is then deposited on the dielectric passivation layer 14 in localized areas to create desired metalized structures. According to the teachings of the present invention, the interconnect metal is formed as the conductive traces comprising the first and second bias lines 12,13 for which improved RF isolation is desired. In the present embodiment, the interconnect metal is a 1–5 micron thick conductive trace, which is typically gold. One or more additional metal layers may be deposited on the trace for purposes of increasing current handling capability. The portion of the bias lines 12,13 that present the greatest likelihood of RF coupling is positioned over the active layer region 6 while the remaining portions of the bias lines 12,13 are positioned over the high resistivity layer region 7. With specific reference to FIG. 4 of the drawings, the active layer region 6 is shown in phantom line to illustrate that the region lies beneath the passivation layer and the overlay metal.

In the specific embodiment of a multiport isolated via, the same basic process shown in FIGS. 6–11 and the accompanying description applies, with the exception that the metal layer of the via pad 3 is deposited prior to the deposition of the passivation layer 14. The passivation layer 14 is then selectively etched to expose the via pad 3. This etching process is not used for the improved isolation bias lines 12,13 embodiment. The etching process comprises masking those areas of the passivation layer that are not to be removed and subjecting the Silicon Nitride covered substrate to an etchant. This removes those exposed portions of the passivation layer 14 that are not protected by the photoresist. As an example, a Silicon Nitride passivation layer may be etched in a flourine containing plasma. Other passivation layers and etchants are possible, the details of which are unimportant to the practice of the present invention and are within the capability of one-of ordinary skill in the art. Additionally, the type of masking technology is also unimportant and within the capabilities of one of ordinary skill in the art. One or more additional metal layers may be deposited on the via pad 3 for purposes of increasing the current handling capability.

An alternative embodiment to the process and structure to achieve the same benefit is to achieve the high resistivity portion by removing the active layer 6 in localized regions to create the localized regions of high resistivity 7. This may be descriptively referred to as the mesa etch embodiment of the present invention. In this embodiment, the active layer 6 is developed according to the process already described to a depth of approximately 0.5 to 1 micron. Those areas of the substrate 5 where a multiport via or an isolated bias line are to be positioned, are masked with a photoresist. This is consistent with current processes and does not require an additional processing step because certain areas destined to be circuit elements such as FETs, diodes, and resistors will maintain a portion of the active layer 6. Those portions of the substrate not protected by the mask are then etched away. This results in removal of the 0.5 to 1 micron active layer 6 to expose the high resistivity semi-insulating substrate 5. In the multiport via embodiment, the via pad 3 metal is then deposited at the appropriate position. Note that this particular process results in a nonuniform surface topology for the substrate 5. In the bias line embodiment, the conductors are printed on the passivation layer 14 at the appropriate position according to the description previously given. In the multiport via embodiment, the passivation layer 14 is etched to expose the via pad so that electrical connection may be made to the signal lines 1,2 to which it is connected.

Other embodiments according to the teachings of the present invention include different substrates including iron doped indium phosphide. Accordingly, materials for dopants, epitaxial layer growth, and metalizations will be different than those previously described. The qualitative teachings contained herein are sufficient to render the necessary modifications to practice the invention using different semiconductor materials at processing chemistry within the scope of the appended claims.

What is claimed is:

1. An RF isolation structure comprising:

a semi-insulating substrate, at least one active region formed in a surface layer of said substrate, said at least one active region being surrounded by at least one high resistivity region formed in said active layer of said substrate, said at least one high resistivity region comprises a damaged active region, said at least one active region and said at least one high resistivity region being disposed in substantially co-planar relation to one another;

a conductive material disposed in overlying relation to only a portion of the active region and only a portion of the high resistivity region; and a layer of dielectric material disposed between said at least one active region and said conductive material and also disposed between said high resistivity region and said conductive material;

wherein said at least one active region provides attenuation to RF energy in said conductive material.

2. An RF isolation structure as recited in claim 1 wherein said semi-insulating substrate comprises gallium arsenide.

3. An RF isolation structure as recited in claim 2 wherein said at least one active region comprises silicon implanted gallium arsenide.

4. An RF isolation structure as recited in claim 3 wherein said at least one high resistivity region comprises boron implanted gallium arsenide.

5. An RF isolation structure as recited in claim 3 wherein said at least one high resistivity region comprises oxygen implanted gallium arsenide.

6. An RF isolation structure as recited in claim 3 wherein said at least one high resistivity region comprises proton implanted gallium arsenide.

7. An RF isolation structure as recited in claim 1 wherein said semi-insulating substrate comprises a doped Indium Phosphide.

8. An RF isolation structure as recited in claim 1 wherein said at least one active region is directly adjacent to said at least one high resistivity region and wherein said conductive material comprises a conductive trace that traverses a portion of said at least one active region and a portion of said at least one high resistivity region.

9. An RF isolation structure as recited in claim 1 wherein said conductive material comprises a conductive via pad terminating at two RF signal lines, said via pad disposed on a surface of said at least one substrate, wherein first and second fractional parts of said via pad are disposed over said at least one active region and third and fourth fractional parts of said via pad are disposed over a portion of said high resistivity region.

10. An RF isolation structure as recited in claim 1 wherein said conductive material comprises a conductive via pad terminating more than two RF signal lines, said via pad disposed on a surface of said substrate, wherein terminating fractional parts of said via pad terminate respective ones of said RF signal lines and said terminating fractional parts are separated by isolating fractional parts.

11. A process for creating a microwave semiconductor RF isolation structure on a substrate comprising the steps of:

creating at least one active region in a surface layer of a semi-insulating substrate, masking portions of said surface layer with a photoresist material, damaging, by ion implantation, portions of said surface layer that are not protected by said photoresist to create at least one high resistivity region disposed coplanar to said at least one active region in said surface layer, wherein the at least one high resistivity region surrounds said at least one active region, removing said photoresist;

applying a dielectric layer over said at least one active region and said at least one high resistivity region;

forming a conductive material on the dielectric layer, said conductive material having first and second contiguous portions, said first portion disposed over only a portion of said active region and said second portion disposed over only a portion of said high resistivity region;

wherein said at least one active region provides attenuation to RF energy in the first portion of the conductive material.

12. The process of claim 11 wherein the step of creating at least one active region in the surface layer comprises implanting a gallium arsenide substrate with silicon to create a layer on the surface of the substrate having a lower resistivity.

13. The process of claim 11 the step of damaging portions of said surface layer comprises implanting with boron.

14. The process of claim 11 further comprising, after the step of forming the conductive material, the steps of:

depositing a passivation layer over the at least one active region and the at least one high resistivity region and etching portions of the passivation layer to expose portions of said conductive material.

* * * * *